US011239160B2

United States Patent
Zhou et al.

(10) Patent No.: US 11,239,160 B2
(45) Date of Patent: Feb. 1, 2022

(54) E-FUSE WITH DIELECTRIC ZIPPING

(71) Applicant: International Business Machines Corporation, Armonk, NY (US)

(72) Inventors: Tianji Zhou, Albany, NY (US); Saumya Sharma, Easton, CT (US); Ashim Dutta, Menands, NY (US); Chih-Chao Yang, Glenmont, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/903,213

(22) Filed: Jun. 16, 2020

(65) Prior Publication Data
US 2021/0391256 A1    Dec. 16, 2021

(51) Int. Cl.
| | |
|---|---|
| *G11C 16/04* | (2006.01) |
| *H01L 23/525* | (2006.01) |
| *H01L 23/522* | (2006.01) |
| *G11C 17/16* | (2006.01) |
| *H01L 23/528* | (2006.01) |
| *G11C 17/18* | (2006.01) |
| *H01L 23/532* | (2006.01) |

(52) U.S. Cl.
CPC .......... *H01L 23/5256* (2013.01); *G11C 17/16* (2013.01); *G11C 17/18* (2013.01); *H01L 23/5226* (2013.01); *H01L 23/5283* (2013.01); *H01L 23/53295* (2013.01)

(58) Field of Classification Search
CPC ..... G11C 17/16; G11C 17/18; H01L 23/5256; H01L 23/5226; H01L 23/5283; H01L 23/53295
See application file for complete search history.

(56) References Cited

U.S. PATENT DOCUMENTS

| | | | |
|---|---|---|---|
| 5,693,556 A | 12/1997 | Cleeves | |
| 6,124,194 A | 9/2000 | Shao et al. | |
| 6,242,789 B1 | 6/2001 | Weber et al. | |
| 6,251,710 B1 | 6/2001 | Radens et al. | |
| 6,278,171 B2 | 8/2001 | Arndt et al. | |
| 6,380,003 B1 | 4/2002 | Jahnes et al. | |

(Continued)

OTHER PUBLICATIONS

R.F. Rizzolo et al., "IBM System z9 eFUSE applications and methodology," IBM Journal of Research and Development, vol. 51, Issue 1-2, Jan. 2007, pp. 65-75.

*Primary Examiner* — Pho M Luu
(74) *Attorney, Agent, or Firm* — L. Jeffrey Kelly; Michael J. Chang, LLC

(57) ABSTRACT

E-fuses and techniques for fabrication thereof using dielectric zipping are provided. An e-fuse device includes: a first dielectric layer disposed on a substrate; at least one first electrode of the e-fuse device present in the first dielectric layer; a second dielectric layer disposed on the first dielectric layer; vias present in the second dielectric layer, wherein at least one of the vias is present over the at least one first electrode and has a critical dimension CDA", wherein the vias adjacent to the at least one via having the critical dimension CDA" each have a critical dimension of CDB", and wherein CDB">CDA"; a liner disposed in each of the vias; and a metal that serves as a second electrode of the e-fuse device disposed in each of the vias over the liner. A method of operating an e-fuse device is also provided.

20 Claims, 16 Drawing Sheets

(56) References Cited

U.S. PATENT DOCUMENTS

| | | | |
|---|---|---|---|
| 7,557,424 B2* | 7/2009 | Wong | H01L 23/5252 |
| | | | 257/529 |
| 8,048,792 B2* | 11/2011 | Beyer | H01L 29/66545 |
| | | | 438/595 |
| 8,071,437 B2* | 12/2011 | Lin | H01L 21/823807 |
| | | | 438/238 |
| 9,059,170 B2 | 6/2015 | Bao et al. | |
| 9,142,506 B2 | 9/2015 | Bonilla et al. | |
| 9,443,860 B1* | 9/2016 | Sung | H01L 27/11206 |
| 2008/0308900 A1 | 12/2008 | Kim et al. | |
| 2017/0263457 A1 | 9/2017 | El-Ghoroury et al. | |

* cited by examiner

E-FUSE WITH DIELECTRIC ZIPPING

FIELD OF THE INVENTION

The present invention relates to electronic fuses (e-fuses), and more particularly, to e-fuses having dimensions below a lithography limit and techniques for fabrication thereof using dielectric zipping.

BACKGROUND OF THE INVENTION

Electronic fuses (e-fuses) are components that can be fabricated in an integrated circuit design. Like a conventional fuse, an e-fuse initially provides a low-resistance, electrically conductive path. That electrically conductive path is broken when the e-fuse is ruptured. Conversely, an anti-fuse performs the opposite function. Namely, an anti-fuse initially has a high resistance that can be switched to a low-resistance, electrically conductive path.

E-fuses and anti-fuses can be fabricated using standard metallization processes such as a copper dual damascene process. With a dual damascene process, lithography and etching techniques are used to pattern features such as trenches and vias in a dielectric. When the trenches are formed before the vias, it is often referred to as a trench-first process. Alternatively, when the vias are formed before the trenches, it is often referred to as a via-first process. The features are then filled with a metal such as copper.

The size of e-fuses fabricated by such conventional fabrication techniques are generally limited by the resolution of the lithography process. However, it may be desirable to employ e-fuses with sub-lithographic dimensions, provide lower switching current and better programming efficiency.

Thus, techniques for fabricating sub-lithographic e-fuses would be desirable.

SUMMARY OF THE INVENTION

The present invention provides electronic fuses (e-fuses) having dimensions below a lithography limit and techniques for fabrication thereof using dielectric zipping. In one aspect of the invention, an e-fuse device is provided. The e-fuse device includes: a first dielectric layer disposed on a substrate; at least one first electrode of the e-fuse device present in the first dielectric layer; a second dielectric layer disposed on the first dielectric layer; vias present in the second dielectric layer, wherein at least one of the vias is present over the at least one first electrode and has a critical dimension CDA", wherein the vias adjacent to the at least one via having the critical dimension CDA" each have a critical dimension of CDB", and wherein CDB">CDA"; a liner disposed in each of the vias; and a metal that serves as a second electrode of the e-fuse device disposed in each of the vias over the liner.

In another aspect of the invention, a method of forming an e-fuse device is provided. The method includes: depositing a first dielectric layer onto a substrate; forming at least one first electrode of the e-fuse device in the first dielectric layer; depositing a second dielectric layer onto the first dielectric layer; patterning vias in the second dielectric layer, wherein at least one of the vias is present over the at least one first electrode and is patterned having a critical dimension of CDA'; depositing a liner into, and lining, each of the vias whereby attractive forces between the liner deposited along opposite sidewalls of the vias reduce the critical dimension of the at least one via present over the at least one first electrode to CDA", wherein CDA"<CDA'; and filling the vias with a metal to form a second electrode of the e-fuse device.

In yet another aspect of the invention, a method of operating an e-fuse device is provided. The method includes: providing the e-fuse device including a first dielectric layer disposed on a substrate; at least one first electrode of the e-fuse device present in the first dielectric layer, wherein the at least one first electrode is a cathode of the e-fuse device; a second dielectric layer disposed on the first dielectric layer; vias present in the second dielectric layer, wherein at least one of the vias is present over the at least one first electrode and has a critical dimension CDA", wherein the vias adjacent to the at least one via having the critical dimension CDA" each have a critical dimension of CDB", and wherein CDB">CDA"; a liner disposed in each of the vias; a metal that serves as a second electrode of the e-fuse device disposed in each of the vias over the liner, wherein the second electrode is an anode of the e-fuse device, and wherein the liner is an e-fuse element that provides an electrical path between the cathode and the anode; and passing a programming current through the e-fuse element to cause the e-fuse element to rupture and thereby open the electrical path between the cathode and the anode.

A more complete understanding of the present invention, as well as further features and advantages of the present invention, will be obtained by reference to the following detailed description and drawings.

DETAILED DESCRIPTION OF PREFERRED EMBODIMENTS

As provided above, the fabrication of e-fuses using conventional techniques is limited by the resolution limit of the lithography process. However, it may be desirable to produce e-fuses at sub-lithographic sizes for better programming efficiency. By 'sub-lithographic' it is meant that the e-fuses have dimensions smaller than what can be achieved directly using a lithography and etching process. Regarding size, reference may also be made herein to the 'critical dimension.' In general, the term 'critical dimension' or CD refers to any dimension that impacts the electrical properties of a semiconductor device structure, such as the diameter of an e-fuse.

Advantageously, it has been found herein that dielectric zipping can be leveraged to produce e-fuses narrower than what can be achieved using standard lithography and metallization processes. Namely, when metal is filled into gaps in a dielectric, adhesive forces between the metal lining the sidewall of smaller gaps will 'zip up' the smaller gaps making those gaps even narrower. This action will also open-up the larger gaps adjacent to the smaller gaps, making those adjacent gaps even wider. The 'zip-up' process is likened to the process of using a zipper to join two items together whereby the action of the zipper brings the two items closer together.

As will be described in detail below, this 'zip up' or 'zipping' effect can be intentionally produced for certain vias by making their lithographic critical dimension (i.e., the critical dimension such as gap diameter that is produced using lithography and etching) relatively smaller than the adjacent vias(s). The adhesive forces and zipping effect will then result in narrowing of the smaller vias creating critical dimensions below the lithography limitation.

Figure 1:
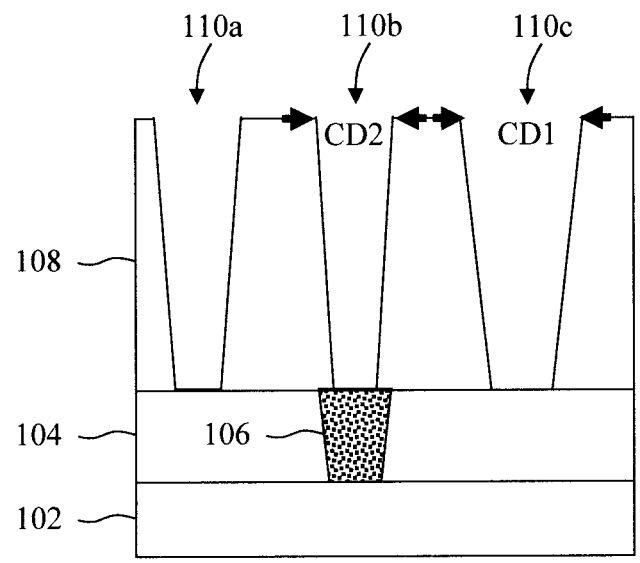
FIG. 1 is a cross-sectional diagram illustrating a dielectric etch having been used to pattern vias with different sizes in a dielectric according to an embodiment of the present invention.
Figure 2:
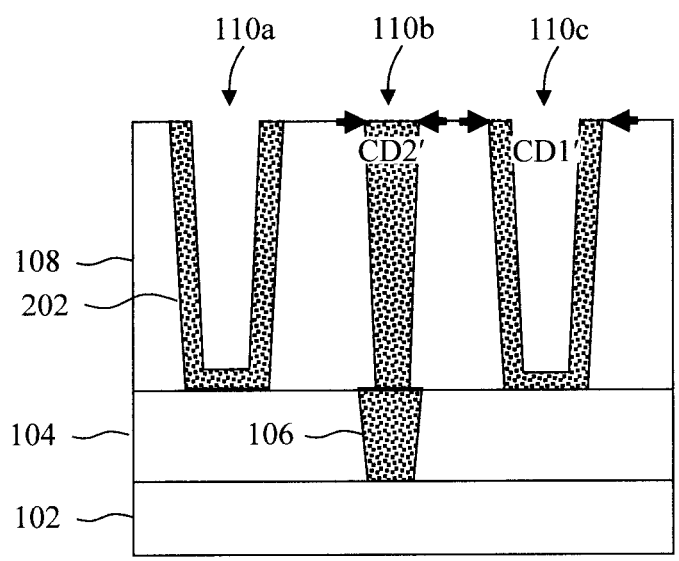
FIG. 2 is a cross-sectional diagram, that follows from FIG. 1, illustrating a conformal liner having been deposited into, and lining, the vias whereby attractive forces between the liner deposited along opposite sidewalls of the vias reduce the critical dimension of the smaller via according to an embodiment of the present invention.

An overview of the present techniques is now provided by way of reference to FIG. 1 and FIG. 2. For instance, referring to FIG. 1, in a first phase of the process a dielectric etch is used to pattern vias 110a,b,c, etc. with different sizes in a dielectric 108. As shown in FIG. 1, according to an exemplary embodiment, dielectric 108 is disposed on a dielectric 104 over a substrate 102. As shown in FIG. 1, dielectric 104 has at least one (first) electrode 106 formed therein. By way of example only, electrode 106 can serve as a cathode of the e-fuse structure.

In one exemplary embodiment, substrate 102 is a bulk semiconductor wafer, such as a bulk silicon (Si), bulk germanium (Ge), bulk silicon germanium (SiGe) and/or bulk III-V semiconductor wafer. Alternatively, substrate 102 can be a semiconductor-on-insulator (SOI) wafer. A SOI wafer includes a SOI layer separated from an underlying substrate by a buried insulator. When the buried insulator is an oxide it is referred to herein as a buried oxide or BOX. The SOI layer can include any suitable semiconductor, such as Si, Ge, SiGe, and/or a III-V semiconductor. Substrate 102 may already have pre-built structures (not shown) such as transistors, diodes, capacitors, resistors, isolation regions (e.g., shallow trench isolation (STI) regions), interconnects, wiring, etc.

Suitable materials for the dielectric 104 and dielectric 108 include, but are not limited to, oxide low-κ materials such as silicon oxide (SiOx) and/or oxide ultralow-κ interlayer dielectric (ULK-ILD) materials, e.g., having a dielectric constant κ of less than 2.7. By comparison, silicon dioxide ($SiO_2$) has a dielectric constant κ value of 3.9. Suitable ultralow-κ dielectric materials include, but are not limited to, porous organosilicate glass (pSiCOH).

Lithography and etching techniques (see below) are employed to pattern the vias 110a,b,c, etc. adjacent to one another in dielectric 108. As shown in FIG. 1, the vias 110a,b,c, etc. have a tapered profile where they are wider at the top than at the bottom, with downward sloping sidewalls. This is a nature of the etching process used to form the vias 110a,b,c, etc., i.e., when etching high aspect ratio structures such as vias the etch rate can decrease over time. As will be described in detail below, this tapered profile can facilitate the zip-up process whereby attractive forces at the bottom of the via (where the sidewalls are in closer together because of the taper) cause zipping-up of the via from the bottom up, similar to the action of a zipper.

As also shown in FIG. 1, the vias 110a,b,c, etc. are intentionally patterned having differing sizes. For instance, according to an exemplary embodiment, vias 110a and 110c have a first critical dimension CD1 and the via 110b, which is in between vias 110a and 110c, and over electrode 106, has a second critical dimension CD2, wherein CD1>CD2. In this example, critical dimension can refer to a diameter at the top opening of the vias 110a,b,c, etc. To use an illustrative, non-limiting example, in one exemplary embodiment, the top opening of vias 110a and 110c each have a diameter of from about 20 nanometers (nm) to about 25 nm and ranges therebetween, and the top opening of via 110b has a diameter of from about 15 nm to about 20 nm and ranges therebetween. Notably, a via 110b of this small size is about at the limit of current lithography technology. To look at it another way, with current lithography technology patterning vias having a top opening with a diameter of less than or equal to about 15 nm is extremely difficult, if at all possible.

Thus, post-patterning, the critical dimension of via 110b is controlled by the lithography-related patterning resolution. However, as will be described in detail below, the zip-up effect will be used to further reduce the size/critical dimension (e.g., top opening diameter) of via 110b. This zip-up of via 110b will increase the size of the adjacent vias 110a and 110c.

Namely, as shown in FIG. 2, the next phase is a metallization phase where a conformal liner 202 is deposited into, and lining, the vias 110a,b,c, etc. Suitable liner materials include, but are not limited to, titanium (Ti), titanium nitride (TiN), tantalum (Ta), tantalum nitride (TaN) and/or ruthenium (Ru). By way of example only, a process such as chemical vapor deposition (CVD), atomic layer deposition (ALD) or physical vapor deposition (PVD) can be employed to deposit the liner 202 into the vias 110a,b,c, etc.

As will be described in detail below, there are attractive forces between the liner 202 along opposite sidewalls of the vias 110a,b,c, etc. However, due to the smaller size of the (middle) via 110b, these attractive forces are stronger at the bottom of via 110b as compared to at the bottoms of vias 110a and 110c. Thus, these stronger attractive forces in via 110b will cause the sidewalls of via 110b to move closer to one another, starting from a bottom of via 110b and moving to a top of via 110b, effectively 'zipping-up' via 110b. Advantageously, this zip-up effect reduces the size of via 110b, i.e., from CD2 to CD2', wherein CD'<CD2. Further, if via 110b is initially patterned at the lower limit of the current lithography technology (see above), then this zip-up process can result in via 110b having a critical dimension that is beyond (i.e., smaller than) the limitation of current lithography. For instance, using the example above, in one exemplary embodiment via 110b is patterned having a critical dimension CD2 (i.e., top opening diameter) of from about 15 nm to about 20 nm and ranges therebetween. Following zip up, via 110b has a critical dimension CD2' (i.e., top opening diameter) of less than or equal to about 10 nm. As shown in FIG. 2, this zipping-up of dielectric 108 increases the size of the adjacent vias 110a and 110c, i.e., from CD1 to CD1', wherein CD1<CD1'. For instance, using the example above, in one exemplary embodiment vias 110a and 110c are patterned each having a critical dimension CD1 (i.e., top opening diameter) of from about 20 nm to about 25 nm and ranges therebetween. Following zip up, vias 110a and 110c each have a critical dimension CD1' (i.e., top opening diameter) of from about 25 nm to about 35 nm and ranges therebetween.

Figure 3:
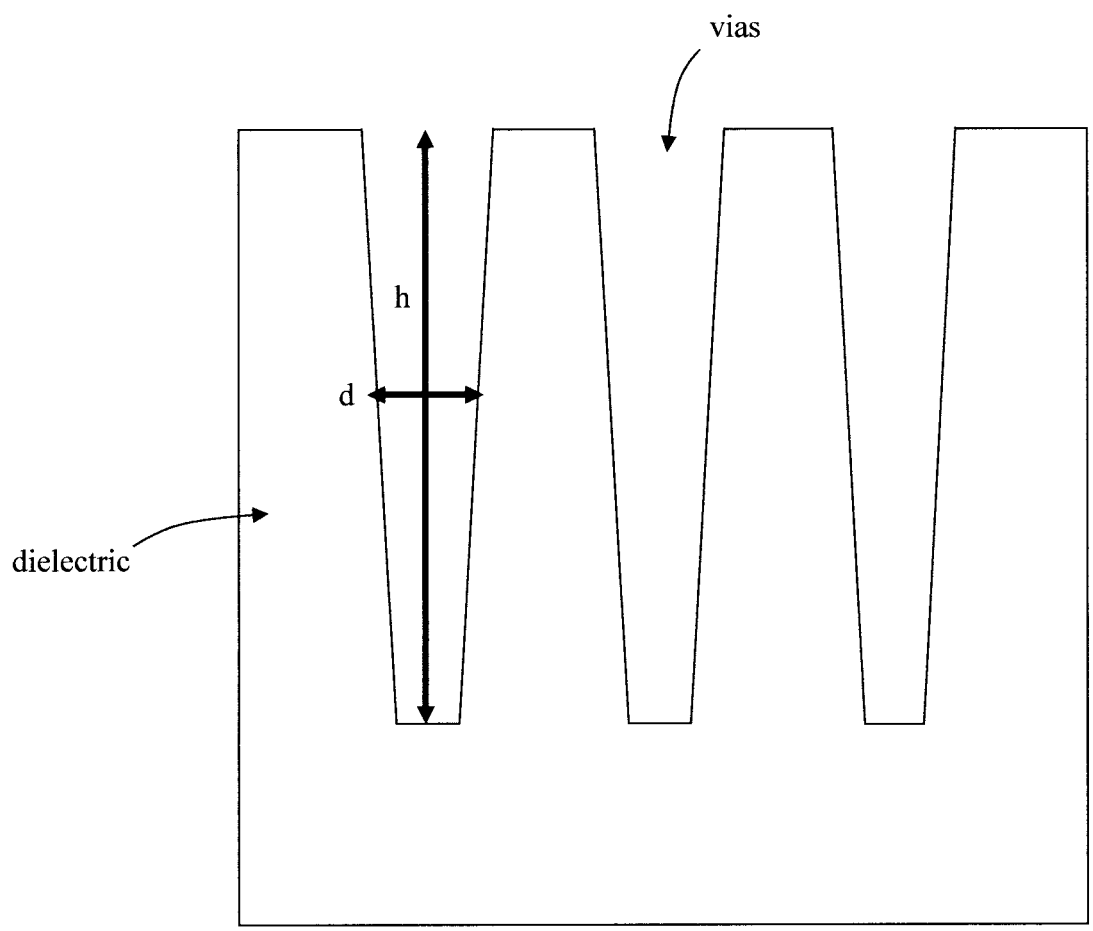
FIG. 3 is a cross-sectional diagram illustrating lithography and etching processes having been employed to pattern high aspect ratio vias adjacent to one another in a dielectric according to an embodiment of the present invention.
Figure 4:
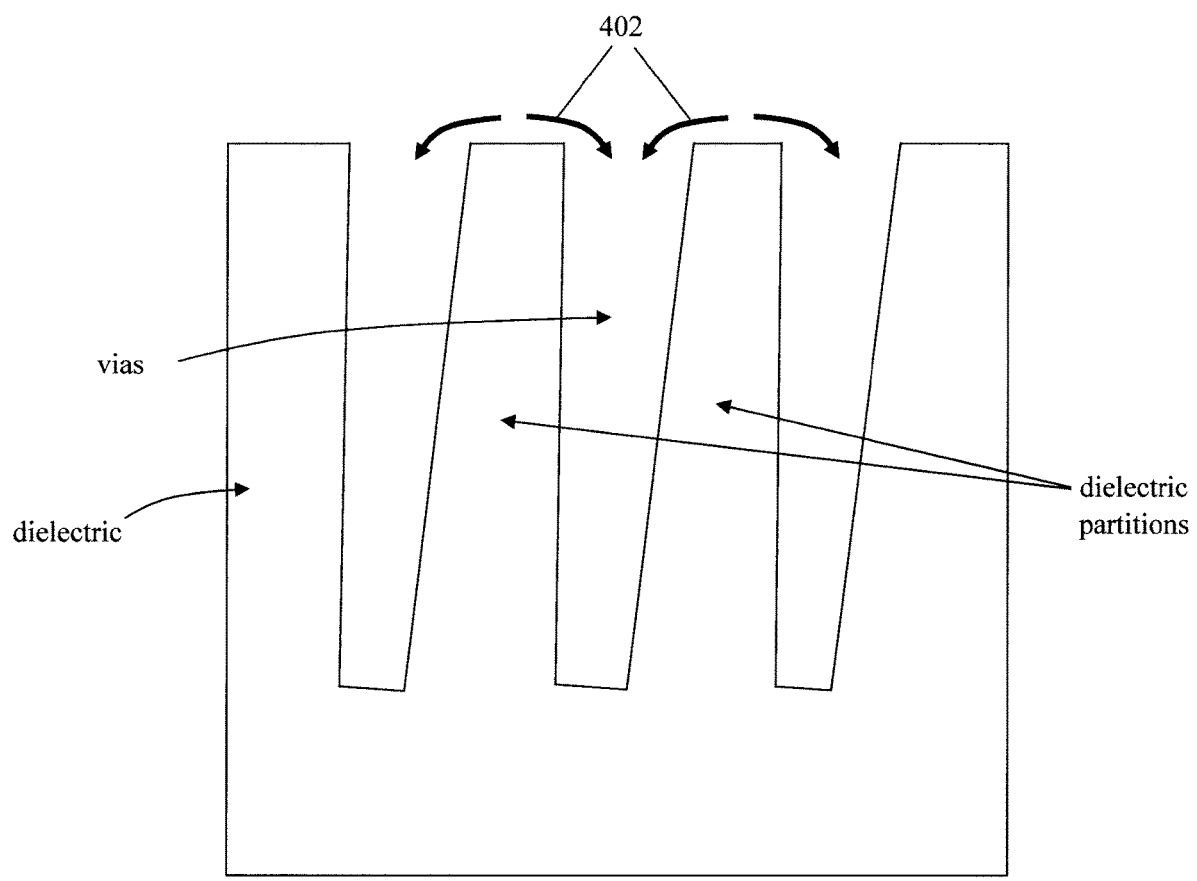
FIG. 4 is a cross-sectional diagram, that follows from FIG. 3, illustrating how the dielectric partitions in between the adjacent vias will sway due to lack of support according to an embodiment of the present invention.

A description of the factors that enable dielectric zipping is now provided by way of reference to FIG. 3 and FIG. 4. As shown in FIG. 3, lithography and etching processes can be employed to produce vias adjacent to one another in a dielectric. The vias have a height h and top opening diameter d and are high aspect ratio structures, i.e., h>>d. Being that the vias are high aspect ratio structures, after patterning the dielectric partitions in between the adjacent vias will sway due to lack of support. See FIG. 4.

Namely, as indicated by arrows 402 in FIG. 4, the portions of the dielectric separating the adjacent vias (also referred to herein as 'dielectric partitions') lack structural support on both sides. Thus, these dielectric partitions will be able to sway. To look at it another way, the position of these dielectric partitions will not be fixed. Instead, these dielectric partitions can move. Advantageously, this movement of the dielectric partitions is leveraged herein, via the zip-up effect, to bring the sidewalls of select vias closer together.

Figure 5:
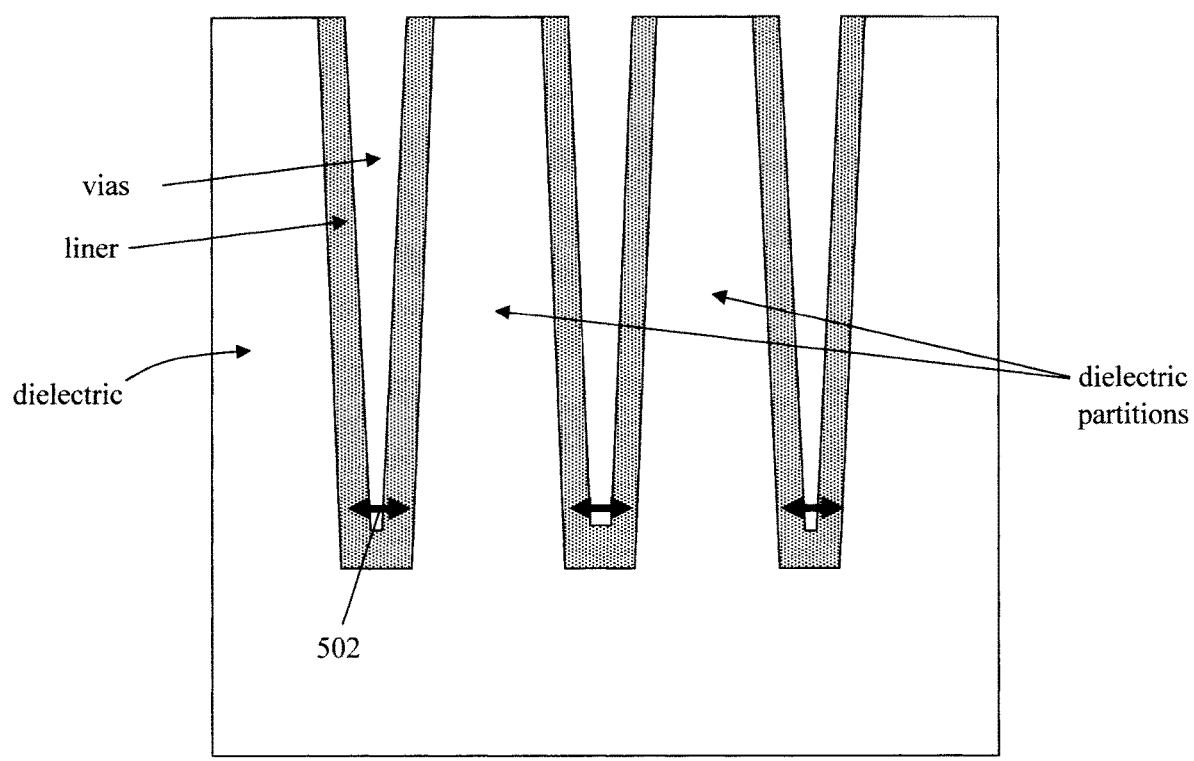
FIG. 5 is a cross-sectional diagram illustrating that when a conformal liner is deposited into, and lining the vias, there is an attractive force between the liner along the opposite sidewalls of each of the vias due to metallic bonding at the bottom of the vias according to an embodiment of the present invention.
Figure 6:
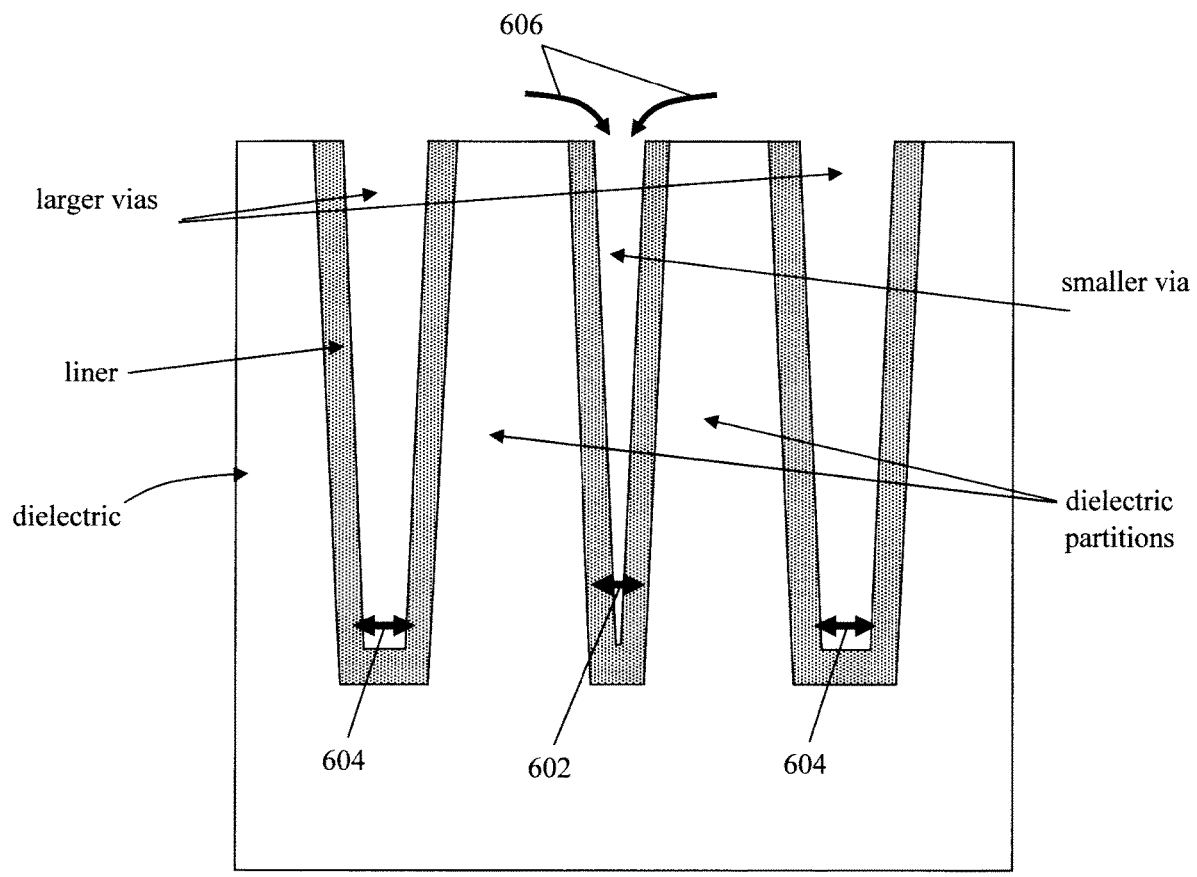
FIG. 6 is a cross-sectional diagram illustrating that if one or more of the vias is intentionally patterned to be smaller than the others, then this smaller via(s) will have a stronger attractive force, and the relatively larger vias will have a relatively weaker attractive force according to an embodiment of the present invention.

A description of the principle of dielectric zipping is now provided by way of reference to FIG. 5 and FIG. 6. As shown in FIG. 5, when a conformal liner (e.g., Ti, TiN, Ta, TaN and/or Ru) is deposited into, and lining the vias, there is an attractive force 502 between the liner along the opposite sidewalls of each of the vias at the bottom of the vias (i.e., as provided above, the vias can have a tapered profile that is narrower at the bottom). This attractive force is the one that binds the atoms together within the liner material. For instance, for Ti the attractive force is metallic, for TiN it is covalent, etc. At the bottom of the vias, this attractive force between liner atoms comes into play and attracts the liner material along the opposite sidewalls to become closer to reduce surface energy. With vias of approximately the same size (as in FIG. 5), these attractive forces are equivalent amongst the vias. Namely, the strength of this attractive force depends on the separation between the sidewalls of the vias.

However, as shown in FIG. 6 if one or more of the vias is intentionally patterned to be smaller than the others, then this smaller via(s) will have a stronger attractive force (see arrow 602), and the relatively larger vias will have a relatively weaker attractive force (see arrows 604). See FIG. 6. Namely, a smaller dielectric gap has a stronger attractive force than a larger gap. Because the dielectric partitions can move/sway (see above), the stronger attractive force in the smaller via(s) versus the weaker attractive force in the larger vias, will drive the dielectric partitions to sway in the desired direction, i.e., towards the smaller via(s)—see arrows 606. The result is the closing of the smaller via(s). To look at it another way, the diameter of the smaller via(s) is further reduced by this process. It is notable that, in order to enable sway of the dielectric partitions between the vias, and for the dielectric partitions to sway in the desired direction (i.e., toward to the smaller via(s)), it is preferable that a smaller via is patterned immediately adjacent to at least one larger via. For instance, as shown in FIG. 6, the smaller via (the center via) is patterned in the dielectric immediately adjacent to two larger vias, one on the right and one on the left. To look at it another way, the smaller via is patterned in between two larger vias. This configuration will enable the dielectric partitions in between the vias to move/sway (due to the zip-up effect) in the desired direction towards the smaller via.

Figure 7:
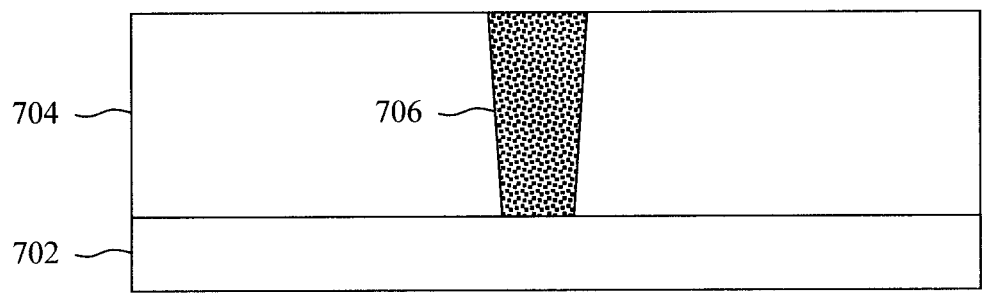
FIG. 7 is a cross-sectional diagram illustrating a starting structure for forming an e-fuse device that includes a first dielectric layer deposited onto a substrate, and at least one (first) electrodes having been formed in the first dielectric layer according to an embodiment of the present invention.
Figure 8:
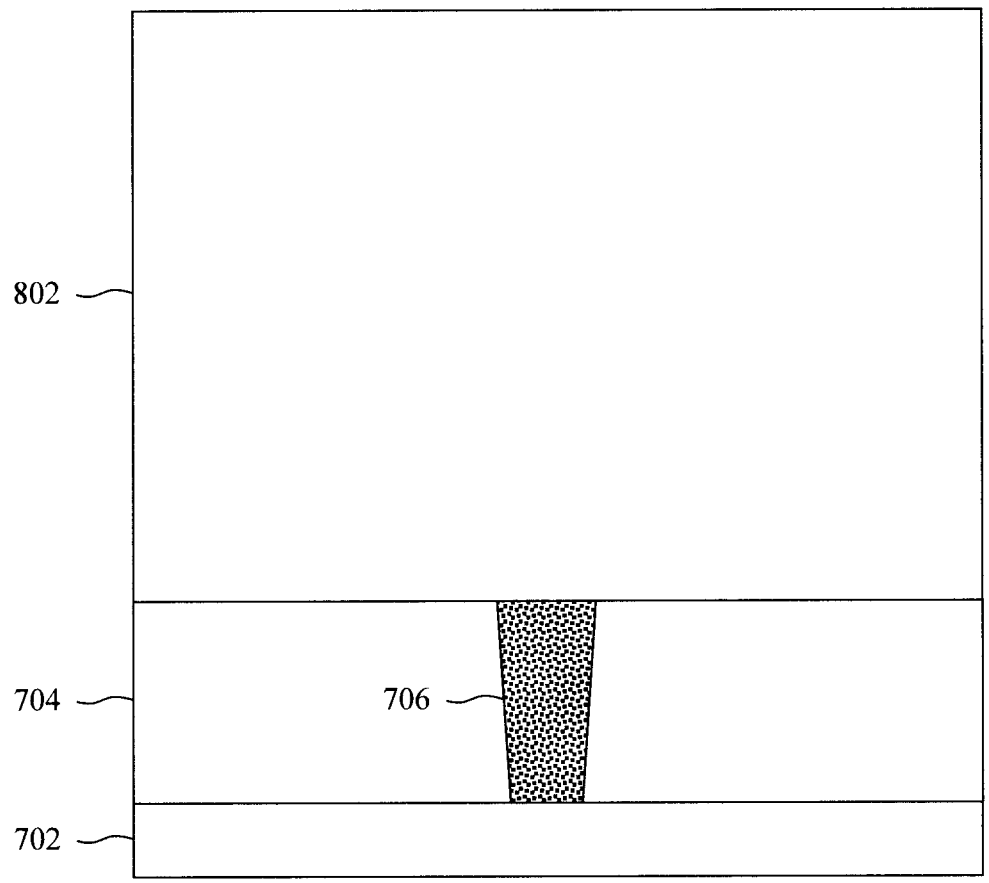
FIG. 8 is a cross-sectional diagram illustrating a (second) dielectric layer having been deposited onto the first dielectric layer according to an embodiment of the present invention.
Figure 9:
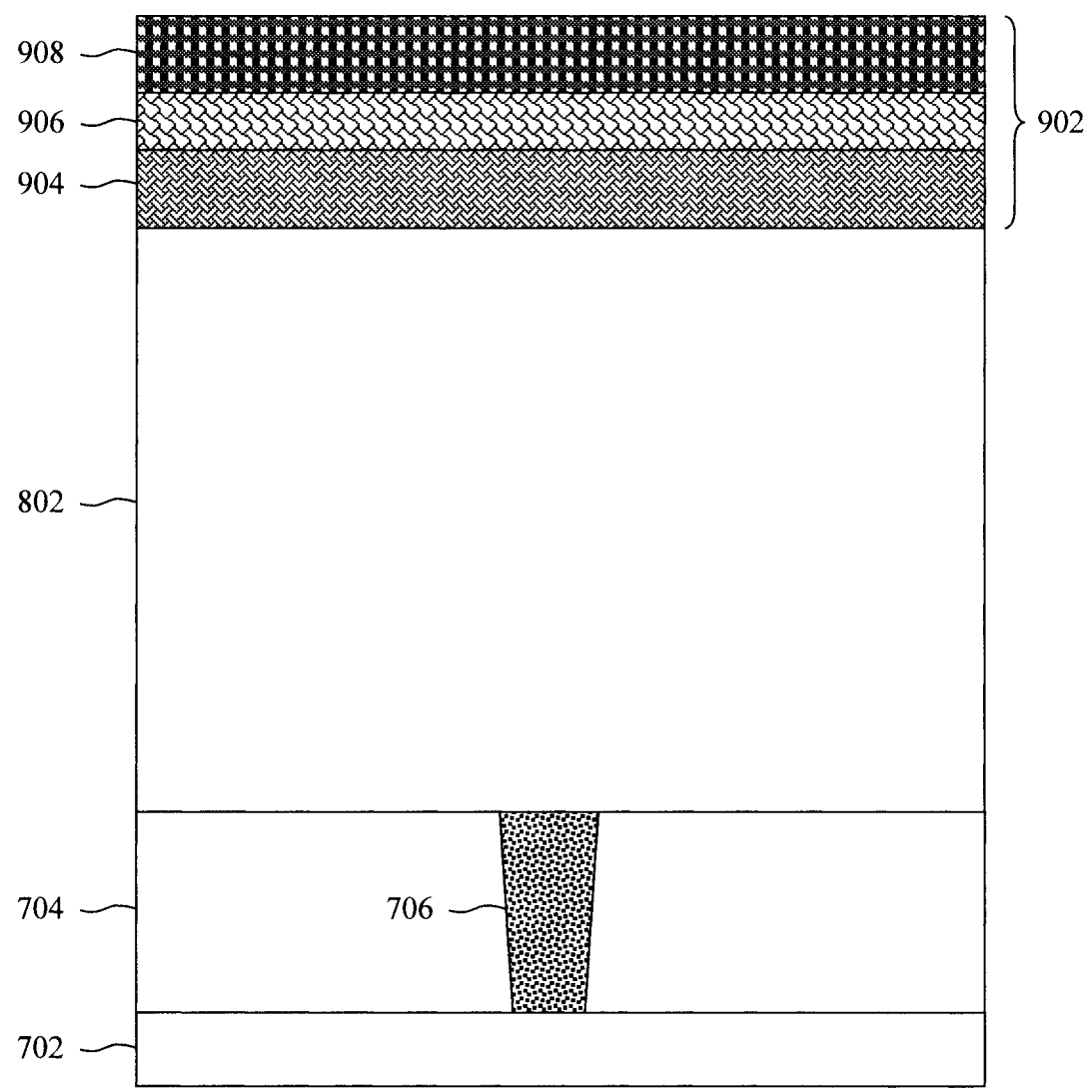
FIG. 9 is a cross-sectional diagram illustrating a lithography stack having been formed on the second dielectric layer having an organic planarizing layer (OPL), an antireflective coating (ARC) layer, and a photoresist according to an embodiment of the present invention.

Given the above overview of the present techniques, an exemplary methodology for forming an e-fuse device in accordance with the present techniques is now described by way of reference to FIGS. 7-17. As shown in FIG. 7, according to an exemplary embodiment, the process begins with the deposition of a dielectric layer 704 on a substrate 702. According to an exemplary embodiment, substrate 702 is a bulk semiconductor wafer, such as a bulk Si, bulk Ge, bulk SiGe and/or bulk III-V semiconductor wafer. Alternatively, substrate 702 can be a SOI wafer having an SOI layer (e.g., Si, Ge, SiGe, and/or a III-V semiconductor) separated from an underlying substrate by a buried insulator (e.g., a BOX). Further, substrate 702 may already have pre-built structures (not shown) such as transistors, diodes, capacitors, resistors, isolation regions (e.g., shallow trench isolation (STI) regions), interconnects, wiring, etc.

Suitable materials for the dielectric layer 704 include, but are not limited to, oxide low-κ materials such as SiOx and/or oxide ULK-ILD materials such as pSiCOH. A process such as CVD, ALD or PVD can be employed to deposit the dielectric layer 704 onto substrate 702. Following deposition, dielectric layer 704 can be planarized using a process such as chemical-mechanical polishing (CMP).

As shown in FIG. 7, at least one (first) electrode 706 is formed in dielectric layer 704. According to an exemplary embodiment, electrode 706 serves as a cathode of the e-fuse device. Standard metallization processes may be employed to form electrode 706 in dielectric layer 704. For instance, lithography and etching techniques are first employed to pattern at least one feature (e.g., trench and/or via) in the dielectric layer 704. The feature(s) is/are then filled with a metal(s) to form the electrode 706. Suitable metals include, but are not limited to, copper (Cu), tungsten (W), ruthenium (Ru), cobalt (Co), nickel (Ni) and/or platinum (Pt). The metal(s) can be deposited into the feature(s) using a process such as evaporation, sputtering, or electrochemical plating. Following deposition, the overburden can be removed using a process such as CMP. Prior to depositing the metal(s) into the features, a conformal barrier layer (not shown) can be deposited into and lining the features. Use of a barrier layer helps to prevent diffusion of the metal(s) into the surrounding dielectric. Suitable barrier layer materials include, but are not limited to, Ti, TiN, Ta, TaN and/or Ru. Additionally, a seed layer (not shown) can be deposited into and lining the feature(s) prior to contact metal deposition. A seed layer facilitates plating of the contact metal into the feature(s). It is notable that, while the formation of a single electrode 706 is shown in FIG. 7, embodiments containing multiple electrodes 706 are also contemplated herein. For instance, by way of example only, one electrode 706 can be formed as the cathode for each e-fuse in the device design.

A (second) dielectric layer 802 (where dielectric layer 704 is the first dielectric layer) is then deposited onto dielectric layer 704 over electrode 706. See FIG. 8. Suitable materials for the dielectric layer 802 include, but are not limited to, oxide low-κ materials such as SiOx and/or oxide ULK-ILD materials such as pSiCOH. A process such as CVD, ALD or PVD can be employed to deposit the dielectric layer 802. Following deposition, dielectric layer 802 can be planarized using a process such as CMP.

Vias (of varying sizes) will be patterned in the dielectric layer 802. To do so, a lithography stack 902 is first formed on the dielectric layer 802. See FIG. 9. According to an exemplary embodiment, lithography stack 902 includes an organic planarizing layer (OPL) 904 disposed on the dielectric layer 802, an antireflective coating (ARC) layer 906 disposed on the OPL 904, and a photoresist 908 disposed on the ARC layer 906. Standard exposure and development processes are then employed to pattern the photoresist 908 with the footprint and location of the vias. See FIG. 10. The as-patterned photoresist is now given reference numeral 908a.

Figure 10:
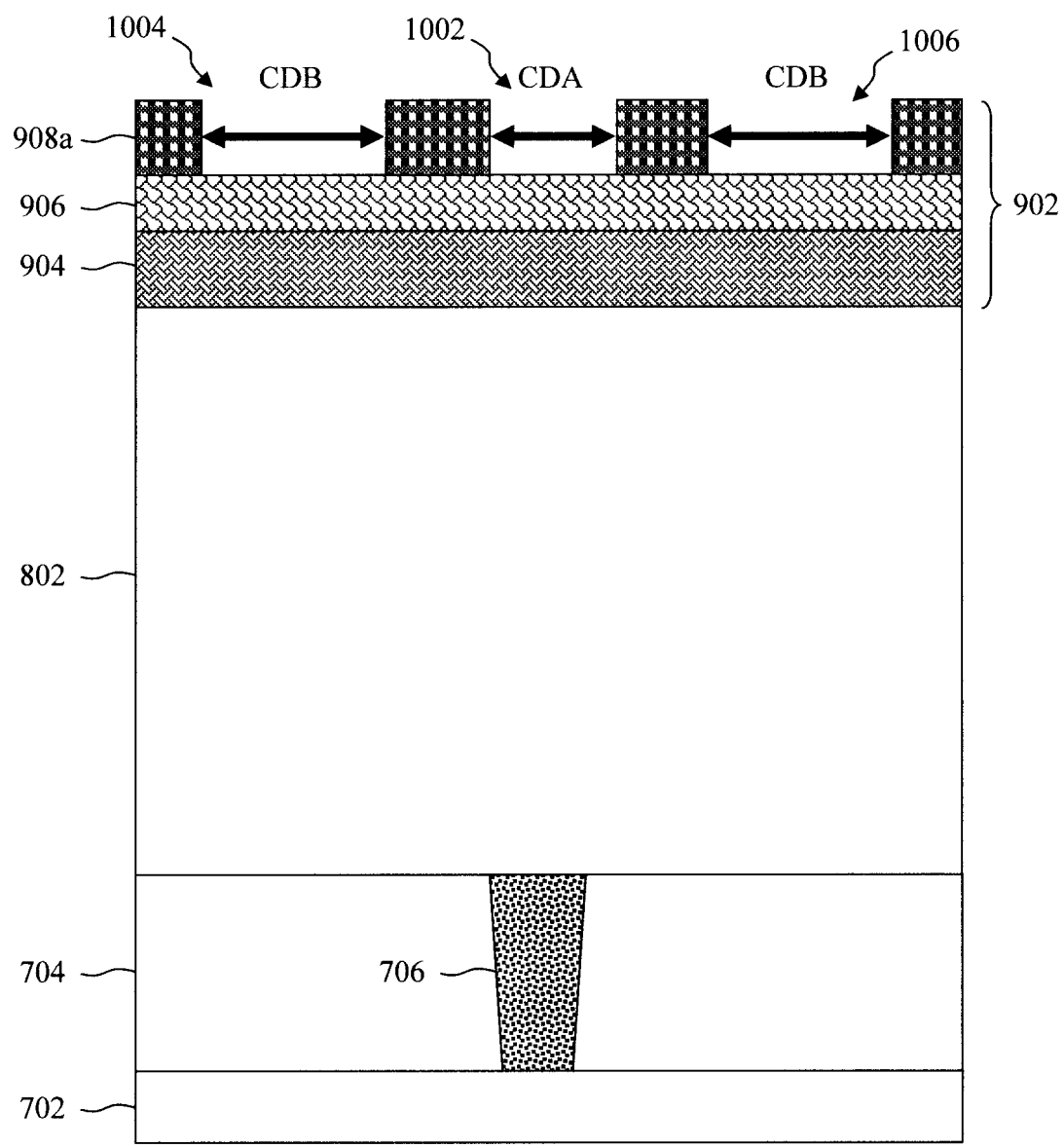
FIG. 10 is a cross-sectional diagram illustrating the photoresist having been patterned with the footprint and location of multiple vias according to an embodiment of the present invention.

As provided above, in order to enable sway of the dielectric partitions between the vias, it is preferable that a smaller via will be formed immediately adjacent to at least one larger via. For instance, according to an exemplary embodiment, as shown in FIG. 10 the pattern in region 1002 of photoresist 908a over electrode 706 has a critical dimension CDA and the pattern neighboring regions 1004 and 1006 of photoresist 908a have a critical dimension CDB, where CDA<CDB. For example, in one exemplary embodiment, CDA is from about 15 nm to about 20 nm and ranges therebetween, whereas CDB is made intentionally larger, e.g., CDB is from about 20 nm to about 25 nm and ranges therebetween. Further, in an exemplary embodiment, CDA is at the lithographic limit, e.g., CDA is about 15 nm.

The pattern from photoresist 908a is then transferred to ARC layer 906 and to OPL 904, after which the remaining photoresist 908a and ARC layer 906, if any, are removed. See FIG. 11. An etch is then used to transfer the pattern from the patterned OPL, now given reference numeral 904a, to dielectric layer 802 to form vias 1102a,b,c, etc. in dielectric layer 802. According to an exemplary embodiment, a directional (anisotropic) etching process such as reactive ion etching (RIE) is employed for the via etch.

Figure 11:
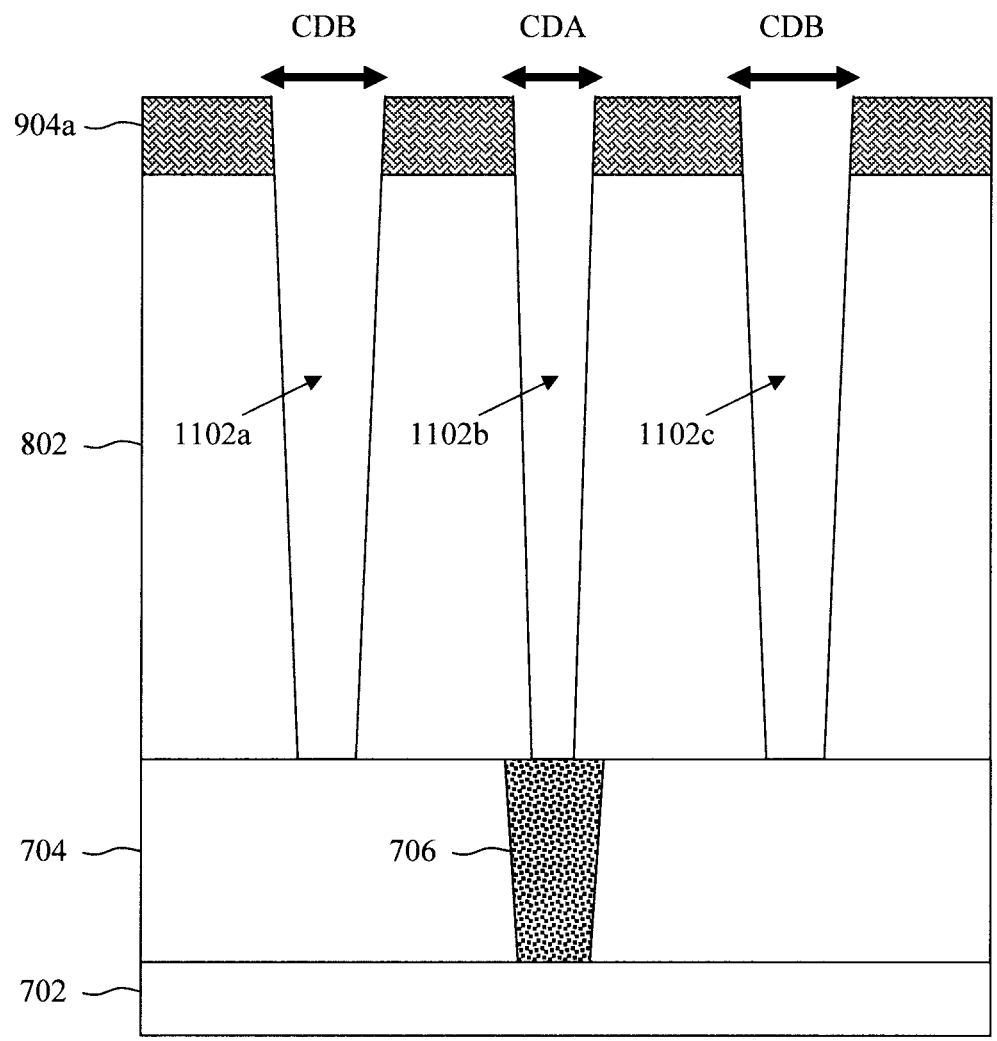
FIG. 11 is a cross-sectional diagram illustrating the pattern from the photoresist having been transferred to ARC layer and to OPL, after which the remaining photoresist and ARC layer, if any, are removed, and an etch having been used to transfer the pattern from the patterned OPL to the second dielectric layer to form vias of varying sizes in the second dielectric layer according to an embodiment of the present invention.
Figure 12:
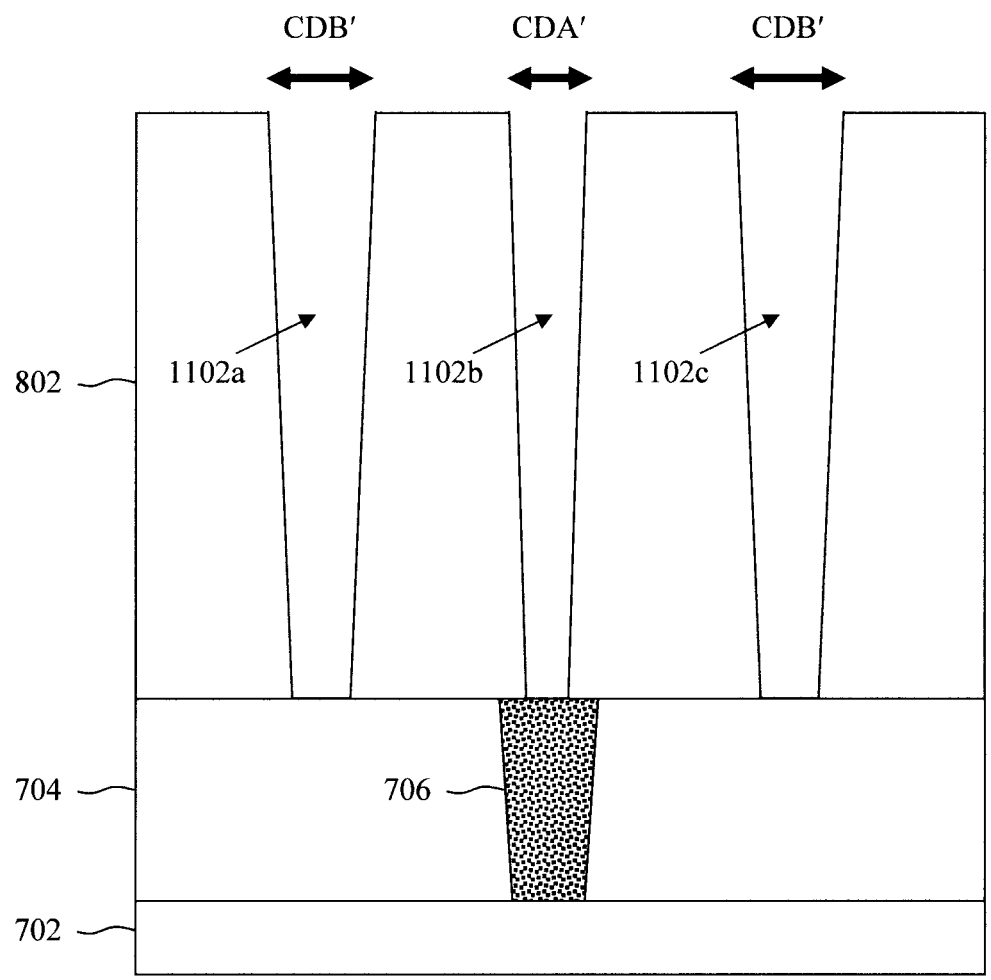
FIG. 12 is a cross-sectional diagram illustrating the remaining OPL having been removed according to an embodiment of the present invention.

As shown in FIG. 11, via 1102b (which is present over electrode 706) is smaller in size than immediately adjacent vias 1102a and 1102c to the left and right of via 1102b, respectively. Namely, based on the above-described process, via 1102b has a development critical dimension (e.g., top opening diameter of OPL 904a) of CDA, whereas the immediately adjacent vias 1102a and 1102c to either side of via 1102b intentionally have a larger development critical dimension (e.g., top opening diameter of OPL 904a) of CDB, i.e., CDA<CDB. Optionally, in one exemplary embodiment, CDA is at the lithography limit (see above). As shown in FIG. 11, vias 1102a,b,c, etc. have a tapered profile where they are wider at the top than at the bottom, with downward sloping sidewalls. As highlighted above, this is due to the nature of the etching process used to form the vias 1102a,b,c, etc. However, this tapered profile facilitates the zip-up process whereby attractive forces at the bottom of the via (where the sidewalls are in closer together because of the taper) cause zipping-up of the via from the bottom up.

Following the patterning of vias 1102a,b,c, etc. in dielectric layer 802, the remaining OPL 904a is removed. See FIG. 12. By way of example only, the remaining OPL 904a can be removed using a standard wet clean process. After removal of the OPL 904a, trench 1102b has a critical dimension (e.g., top opening diameter) of CDA', whereas the immediately adjacent trenches 1102a and 1102c to either side of trench 1102b have a critical dimension (e.g., top opening diameter) of CDB'. Due to the nature of the etching process and the OPL 904a being thin, CDA' is close to CDA, and CDB' is close to CDB. For example, in one exemplary embodiment, OPL 904a has a thickness of 60 nm, while the directional etching process creates a taper angle of 89 degrees, resulting a difference of −1 nm between CDA and CDA'.

Figure 13:
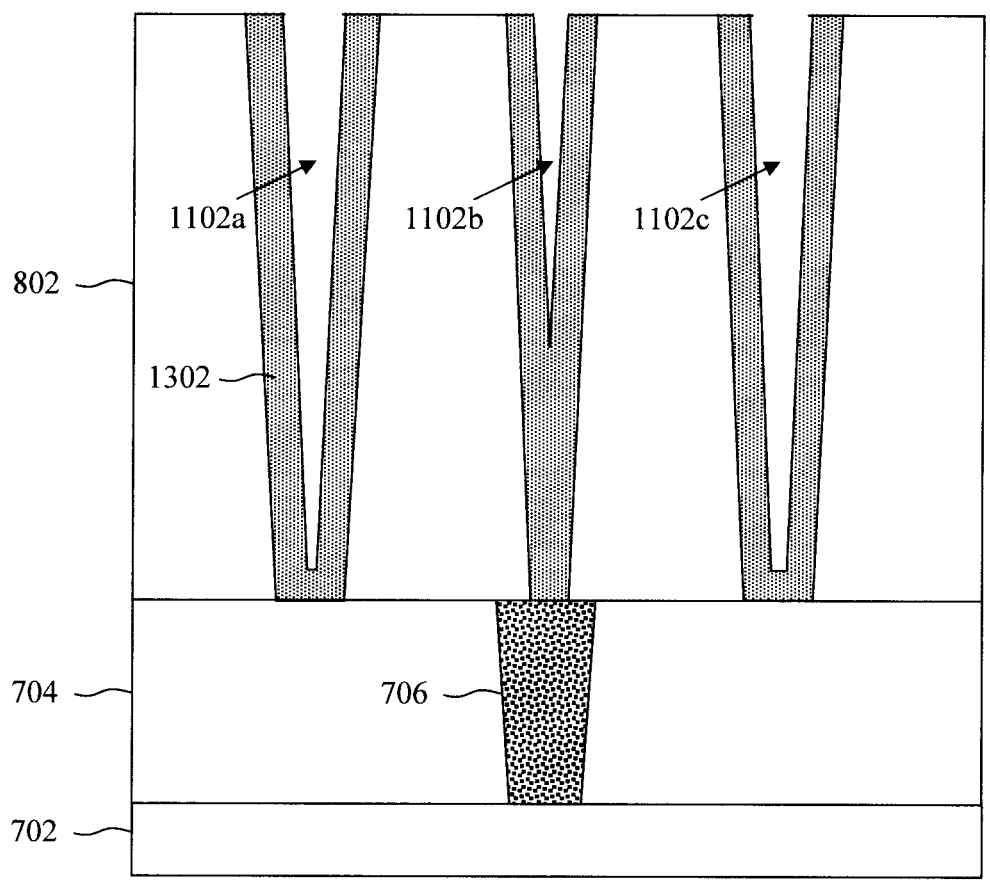
FIG. 13 is a cross-sectional diagram illustrating a conformal liner having been deposited into, and lining, the vias according to an embodiment of the present invention.

A conformal liner 1302 is then deposited into, and lining, the vias 1102a,b,c, etc. See FIG. 13. Suitable materials for liner 1302 include, but are not limited to, Ti, TiN, Ta, TaN and/or Ru. A process such as CVD, ALD or PVD can be employed to deposit the liner 1302. According to an exemplary embodiment, liner 1302 has a thickness of from about 2 nm to about 5 nm and ranges therebetween. As shown in FIG. 13, the same thickness liner 1302 is deposited into each of the vias 1102a,b,c, etc. however due to vias 1102a,b,c, etc. being of different sizes, the liner 1302 along the sidewalls of via 1102b is in closer proximity to the opposite sidewall than the liner 1302 along the sidewalls of vias 1102a and 1102c. In fact, the liner 1302 along the opposite sidewalls of via 1102b is actually touching at the bottom of via 1102b.

Figure 14:
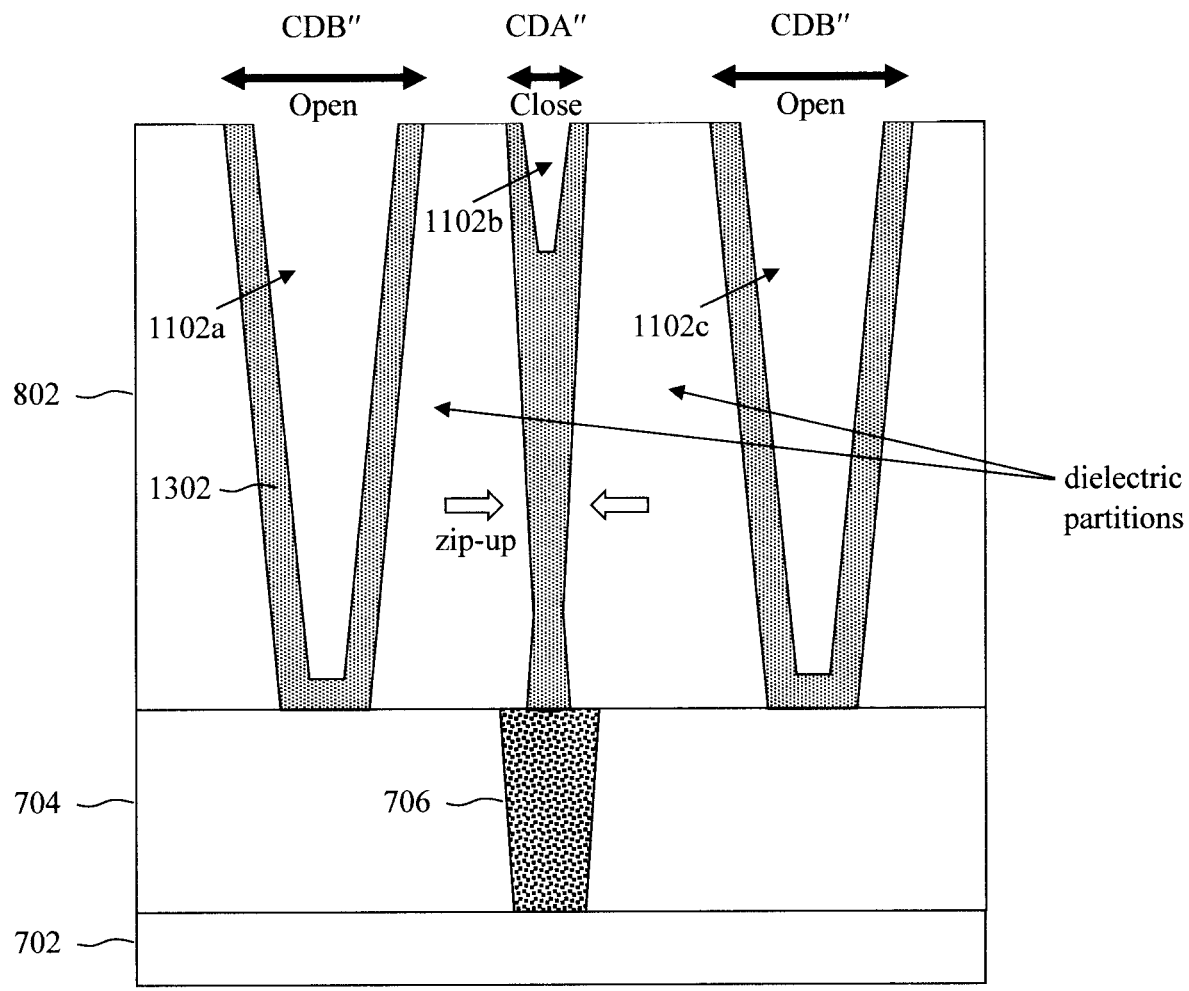
FIG. 14 is a cross-sectional diagram illustrating stronger attractive forces in the smaller via causing the dielectric partitions between the vias to move towards the smaller via, starting from a bottom of the smaller via and moving to a top of the smaller via, 'zipping-up' the smaller via, and increasing the size of the adjacent vias according to an embodiment of the present invention.

As described above, as a result, these attractive forces due to metallic bonding are stronger at the bottom of via 1102b as compared to at the bottoms of vias 1102a and 1102c. Thus, these stronger attractive forces in via 1102b will cause the dielectric partitions between the vias 1102a,b,c, etc. to move towards via 1102b, starting from a bottom of via 1102b and moving to a top of via 1102b, effectively 'zipping-up' via 1102b. See FIG. 14. As shown in FIG. 14, this zip-up effect will further reduce/close the size/critical dimension (e.g., top opening diameter) of via 1102b, i.e., to CDA″ where CDA″<CDA′. In turn, this zip-up of via 110b will increase/open the size/critical dimension of the adjacent vias 1102a and 1102c, i.e., to CDB″ where CDB″>CDB′. According to an exemplary embodiment, the critical dimension of via 1102b is now below (i.e., less than) the lithography limit, i.e., CDA″ is less than about 15 nm. For example, in one exemplary embodiment, CDA″ is less than about 10 nm, and CDB′ is from about 30 nm to about 35 nm and ranges therebetween.

A fill metal 1502 is then deposited into/filling vias 1102a,b,c, etc. over liner 1302. See FIG. 15. Suitable fill metals include, but are not limited to, Cu, W, Ru, Co, Ni, and/or Pt. The fill metal 1502 can be deposited into the vias 1102a,b,c, etc. using a process such as evaporation, sputtering, or electrochemical plating. The fill metal 1502 serves as a second electrode of the e-fuse device. According to an exemplary embodiment, (first) electrode 706 is a cathode of the e-fuse device and fill metal 1502/(second) electrode is an anode of the e-fuse device. However, the functionality of these first/second electrodes can be reversed, and embodiments are contemplated herein where electrode 706 is an anode of the e-fuse device and fill metal 1502 is a cathode of the e-fuse device.

Figure 15:
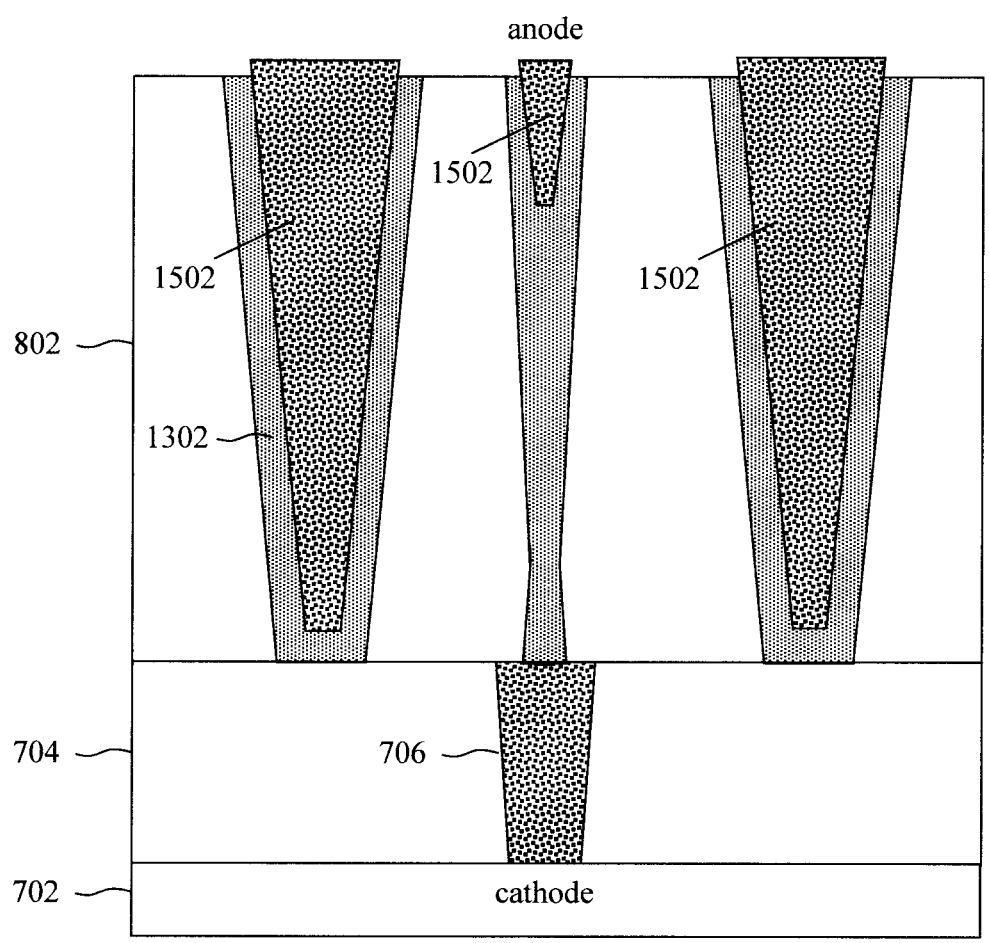
FIG. 15 is a cross-sectional diagram illustrating a fill metal having been deposited into/filling the vias over the liner which serves as a second electrode of the e-fuse device according to an embodiment of the present invention.
Figure 16:
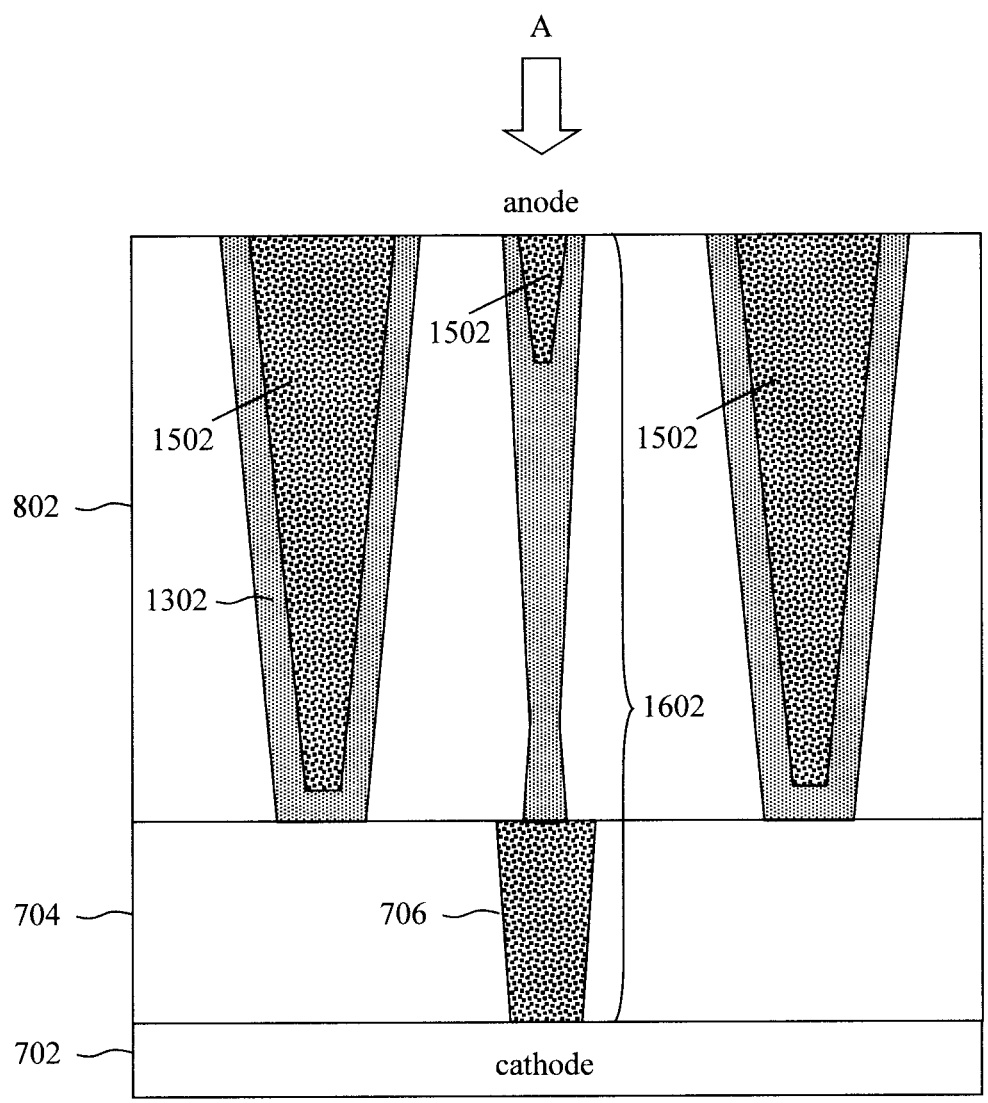
FIG. 16 is a cross-sectional diagram illustrating an overburden of the fill metal having been removed using chemical-mechanical polishing (CMP) according to an embodiment of the present invention.

As shown in FIG. 15, following deposition, the fill metal 1502 can overfill the vias 1102a,b,c, etc. This metal 'overburden' can be removed using a process such as CMP. See FIG. 16. The top surface of the fill metal 1502 is now coplanar with a top surface of the dielectric layer 802. It is notable that, while the electrode 706 (cathode) is present beneath the center via 1102b to form e-fuse 1602, it is to be understood that cathode electrodes (not shown) can also be formed in the same manner as described above under one or more of the e-fuse structures formed in the adjacent vias 1102a and 1102c.

Figure 17:
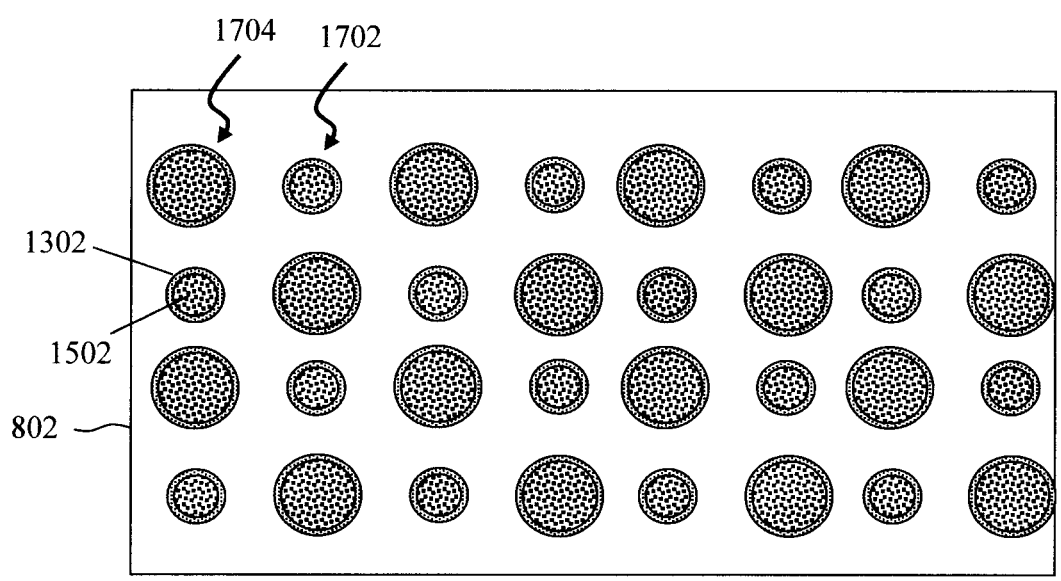
FIG. 17 is a top-down diagram illustrating the present e-fuse device structure according to an embodiment of the present invention.

A top-down view (i.e., from viewpoint A—see FIG. 16) of the present e-fuse device structure is provide in FIG. 17. As shown in FIG. 17, the present dielectric zipping-based techniques can be employed to produce e-fuses 1702 of smaller (e.g., sub-lithographic) sizes by intentionally producing larger e-fuse structures 1704 adjacent to the smaller e-fuses 1702. Notable advantages of the present e-fuse device design include the ability to produce high aspect ratio e-fuses that are not limited by the lithography limit bottleneck. As highlighted above, pushing the e-fuse critical dimensions below the lithography limit provides better programming efficiency and less electron density.

Figure 18:
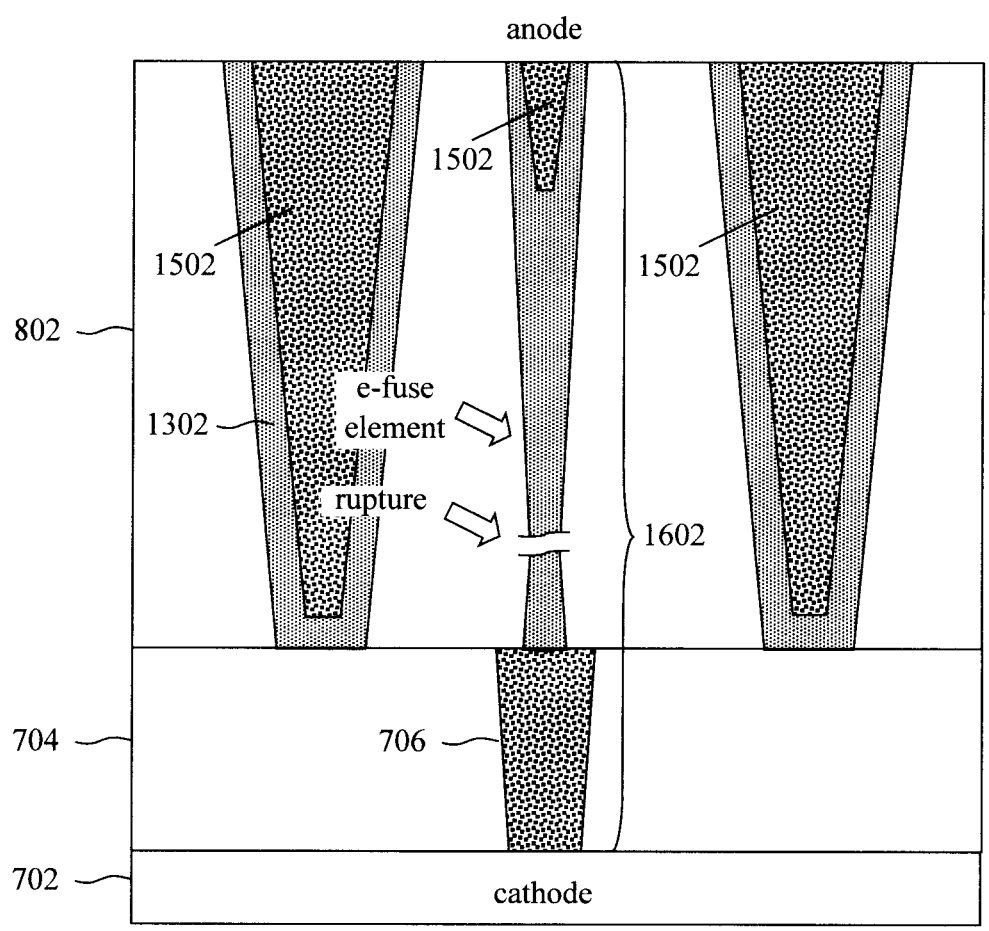
FIG. 18 is a cross-sectional diagram illustrating an exemplary methodology for operating the present e-fuse device according to an embodiment of the present invention.

An exemplary methodology for operating an e-fuse device formed in accordance with the present techniques is now described by way of reference to FIG. 18. As shown in FIG. 18, liner 1302 in e-fuse 1602 forms an e-fuse element interconnecting the cathode (electrode 706) and the anode (fill metal 1502). When intact, the e-fuse element provides a low-resistance electrical path between the cathode and the anode. However, when a high programming current (e.g., greater than or equal to about 25 milliamps (mA)) is passed through the e-fuse element of e-fuse 1602, this will cause the e-fuse element to rupture due for example to resistive heating. See FIG. 18. Rupturing of the e-fuse element opens the electrical path between the cathode and the anode, forming an open circuit.

Although illustrative embodiments of the present invention have been described herein, it is to be understood that the invention is not limited to those precise embodiments, and that various other changes and modifications may be made by one skilled in the art without departing from the scope of the invention.

What is claimed is:

1. An electronic-fuse (e-fuse) device, comprising:
   a first dielectric layer disposed on a substrate;
   at least one first electrode of the e-fuse device present in the first dielectric layer;
   a second dielectric layer disposed on the first dielectric layer;
   vias present in the second dielectric layer, wherein at least one of the vias is present over the at least one first electrode and has a critical dimension CDA″, wherein the vias adjacent to the at least one via having the critical dimension CDA″ each have a critical dimension of CDB″, and wherein CDB″>CDA″;
   a liner disposed in each of the vias; and
   a metal that serves as a second electrode of the e-fuse device disposed in each of the vias over the liner.

2. The e-fuse device of claim 1, wherein the first dielectric layer and the second dielectric layer each comprises a material selected from the group consisting of: silicon oxide (SiOx), porous organosilicate glass (pSiCOH), and combinations thereof.

3. The e-fuse device of claim 1, wherein the at least one first electrode comprises a metal selected from the group consisting of: copper (Cu), tungsten (W), ruthenium (Ru), cobalt (Co), nickel (Ni), platinum (Pt), and combinations thereof.

4. The e-fuse device of claim 1, wherein the fill metal is selected from the group consisting of: Cu, W, Ru, Co, Ni, Pt, and combinations thereof.

5. The e-fuse device of claim 1, wherein the liner comprises a material selected from the group consisting of: titanium (Ti), titanium nitride (TiN), tantalum (Ta), tantalum nitride (TaN), ruthenium (Ru), and combinations thereof.

6. The e-fuse device of claim 1, wherein the liner has a thickness of from about 2 nm to about 5 nm and ranges therebetween.

7. The e-fuse device of claim 1, wherein the vias each have a tapered profile.

8. The e-fuse device of claim 1, wherein the at least one first electrode comprises a cathode of the e-fuse device, and wherein the second electrode comprises an anode of the e-fuse device.

9. The e-fuse device of claim 1, wherein CDA″ is below a lithography limit of about 15 nm.

10. A method of forming an e-fuse device, the method comprising the steps of:
    depositing a first dielectric layer onto a substrate;
    forming at least one first electrode of the e-fuse device in the first dielectric layer;
    depositing a second dielectric layer onto the first dielectric layer;
    patterning vias in the second dielectric layer, wherein at least one of the vias is present over the at least one first electrode and is patterned having a critical dimension of CDA′;
    depositing a liner into, and lining, each of the vias whereby attractive forces between the liner deposited along opposite sidewalls of the vias reduce the critical dimension of the at least one via present over the at least one first electrode to CDA", wherein CDA"<CDA'; and filling the vias with a metal to form a second electrode of the e-fuse device.

11. The method of claim 10, wherein the first dielectric layer and the second dielectric layer each comprises a material selected from the group consisting of: SiOx, pSiCOH, and combinations thereof.

12. The method of claim 10, wherein the at least one first electrode comprises a metal selected from the group consisting of: Cu, W, Ru, Co, Ni, Pt, and combinations thereof.

13. The method of claim 10, wherein the fill metal is selected from the group consisting of: Cu, W, Ru, Co, Ni, Pt, and combinations thereof.

14. The method of claim 10, wherein the liner comprises a material selected from the group consisting of: Ti, TiN, Ta, TaN, Ru, and combinations thereof.

15. The method of claim 10, wherein the liner has a thickness of from about 2 nm to about 5 nm and ranges therebetween.

16. The method of claim 10, wherein the vias adjacent to the at least one via present over the at least one first electrode each are patterned having a critical dimension of CDB', wherein CDA'<CDB', and wherein the attractive forces in the vias adjacent to the at least one via present over the at least one first electrode are weaker than the attractive forces in the at least one via present over the at least one first electrode.

17. The method of claim 16, wherein reduction of the critical dimension of the at least one via present over the at least one first electrode increases the critical dimension of the vias adjacent to the at least one via present over the at least one electrode to CDB", wherein CDB">CDB'.

18. The method of claim 16, wherein CDA' is from about 15 nm to about 20 nm and ranges therebetween.

19. The method of claim 16, wherein CDB' is from about 20 nm to about 25 nm and ranges therebetween.

20. A method of operating an e-fuse device, the method comprising the steps of:
providing the e-fuse device comprising:
a first dielectric layer disposed on a substrate;
at least one first electrode of the e-fuse device present in the first dielectric layer, wherein the at least one first electrode comprises a cathode of the e-fuse device;
a second dielectric layer disposed on the first dielectric layer;
vias present in the second dielectric layer, wherein at least one of the vias is present over the at least one first electrode and has a critical dimension CDA", wherein the vias adjacent to the at least one via having the critical dimension CDA" each have a critical dimension of CDB", and wherein CDB">CDA";
a liner disposed in each of the vias;
a metal that serves as a second electrode of the e-fuse device disposed in each of the vias over the liner, wherein the second electrode comprises an anode of the e-fuse device, and wherein the liner comprises an e-fuse element that provides an electrical path between the cathode and the anode; and
passing a programming current through the e-fuse element to cause the e-fuse element to rupture and thereby open the electrical path between the cathode and the anode.

* * * * *